United States Patent [19]

Partovi et al.

[11] Patent Number: 5,764,089
[45] Date of Patent: Jun. 9, 1998

[54] DYNAMIC LATCHING DEVICE

[75] Inventors: Hamid Partovi, Sunnyvale; Robert C. Burd, Santa Clara; Udin Salim; Frederick Weber, both of San Jose; Luigi Di Gregorio, Sunnyvale; Donald A. Draper, San Jose, all of Calif.

[73] Assignee: Altera Corporation, San Jose, Calif.

[21] Appl. No.: 706,212

[22] Filed: Aug. 30, 1996

Related U.S. Application Data

[60] Provisional application No. 60/003,563, Sep. 11, 1995 and provisional application No. 60/007,263 Nov. 6, 1995.

[51] Int. Cl.⁶ .................................................. H03K 3/037
[52] U.S. Cl. .......................... 327/200; 327/208; 327/212
[58] Field of Search .................................... 327/200, 208, 327/212

[56] References Cited

U.S. PATENT DOCUMENTS

| | | | |
|---|---|---|---|
| 5,517,145 | 5/1996 | Frank | 327/208 |
| 5,646,566 | 7/1997 | Ross, Jr. et al. | 327/200 |

FOREIGN PATENT DOCUMENTS

| | | | |
|---|---|---|---|
| 404239810 | 8/1992 | Japan | 327/212 |

OTHER PUBLICATIONS

Bowhill William, "A 300 MHz 64b Quad–Issue CMOS RISC Microprocessor," 1995 IEEE International Solid–State Circuits Conference entitled Digest of Technical Papers, First Edition, Catalogue No. 95CH35753, Session 10, Microprocessors, Paper TP 10.7, pp. 182–183, 362.

Chappell Terry, "A 2–ns Cycle, 3.8–ns Access 512–kb CMOS ECL SRAM With a Fully Pipelined Architecture," IEEE Journal of Solid–State Circuits, vol. 26, No. 11, Nov. 1991, pp. 1577–1585.

Dobberpuhl Daniel, "A 200–MHZ 64–b Dual–Issue CMOS Microprocessor," IEEE Journal of Solid–State Circuits, vol. 27, No. 11, Nov. 1992, pp. 1555–1567.

Primary Examiner—Margaret Rose Wambach
Attorney, Agent, or Firm—Townsend and Townsend and Crew LLP

[57] ABSTRACT

A high-performance dynamic flip-flop circuit implementation. The dynamic flip-flop circuit comprises an "implicit" one-shot to generate a delayed clock output (319). The flip-flop comprises a delay block (317) coupled to a clock input (305). The flip-flop may be a D-type flip-flop. In a positive-edge-triggered embodiment of the flip-flop, a falling edge (440) of the delayed clock output (319) follows a rising edge (444) of a clock signal after a delay period (448). The flip-flop clocks in new data at a data input (305) in response to the clock input (310) during this delay period (448). Data is held in a storage block (360). The flip-flop has extremely good transient characteristics, especially set-up and clock-to-output times. The flip-flop consumes no static power.

26 Claims, 10 Drawing Sheets

Single-ended Dynamic HLFF

FIG. 2  Dynamic XOR Circuit Driven by TLL TYPE 2

Single-ended Dynamic HLFF

Dual-rail Dynamic HLFF

DHLFF for Self-Resetting Circuits

DYNAMIC LATCHING DEVICE

This application claims the benefit of Provisional Application No. 60/003,563, filed Sep. 11, 1995, and Provisional Application No. 60/007,263, filed Nov. 6, 1995, both of which are incorporated herein by reference.

BACKGROUND OF THE INVENTION

This invention relates to the field of digital logic circuits. More specifically, the present invention is a high-performance flip-flop circuit, especially useful in the design of high-performance electronic circuits.

A digital system is made up of logic elements including AND gates, OR gates, NAND gates, NOR gates, inverters, flip-flops, multiplexers, and many others. These basic logic elements are combined and used to create larger, more complex logic functions such as registers, shifters, accumulators, state machines, processing units, and microprocessors, to name a few. These functions may be embodied on integrated circuits, printed circuit boards, and other similar techniques. Ultimately, these logic elements are used to create digital systems, which may contain millions of logic elements, or even more. Some examples of digital systems are computers, automated teller machines, modems, network servers, telecommunications systems, global positioning systems, satellite controllers, automotive controllers, industrial automation controllers, embedded controllers, laser printer controllers, and application specific hardware.

Rapidly advancing technology allows the creation of more complex, higher functionality, and higher performance digital systems. Although existing digital systems have generally met with substantial success, improvements are continually needed to address the limitations of the present technology, and to provide even greater functionality. Improvements in process technology for integrated circuits allow greater numbers of logic elements to be placed on a single chip. Improvement in the logic elements themselves and accompanying layout also saves valuable silicon area, which increases the logic density. For example, reducing the number of logic elements needed to implement a logical function leads to an increase in the number of functions an electronic circuit can provide. Furthermore, digital systems need to provide increasingly higher performance. Since logic elements form the critical path for digital systems, higher performance logic elements can directly improve the overall performance of the system. For example, a microprocessor may contain more than 50,000 flip-flops; improving the performance of a basic flip-flop will generally greatly improve the overall performance of the processor. In addition to providing greater functionality and better performance, the logic elements must also provide reliability and low power consumption.

SUMMARY OF THE INVENTION

The present invention is a high-performance dynamic flip-flop characterized by improved efficiency, enhanced operating characteristics, and reduced size. Flip-flops are a basic logic element used to build digital systems. The present invention may be used in many types of digital circuits and systems. For example, the present invention may be used in the design of a high-performance integrated circuit such as a microprocessor.

The flip-flop of the present invention may be a D, J-K, S-R, or other type of flip-flop. Further, the flip-flop may be clocked on a positive or negative edge of a clock. In short, the flip-flop circuit comprises an "implicit" one-shot to generate a delayed clock output. The flip-flop comprises a delay block coupled to a clock input. For a clock signal at the clock input, a corresponding delayed clock output signal is generated at an output of the delay block.

More specifically, in a positive-edge-triggered embodiment of the flip-flop, a falling edge of the delayed clock output signal follows a rising edge of a clock signal after a delay period. Generally, this delay period should be less than a clock-to-output time of the flip-flop. When the clock is low, the flip-flop is precharged. The flip-flop clocks in new data at a data input in response to the clock input during this delay period. Data is held in a storage block until the next precharge cycle. The data is output using a Q output. An inverted output may be provided using a QB output.

The flip-flop of the present invention has extremely good transient characteristics, especially set-up and clock-to-output times, and consequently, high operating frequencies. Additionally, there is reduction in the capacitive loading on the clock network due to the reduced size of the devices. As a result, the design of the clock network for a circuit is simplified, while clock skew, switching noise, and power dissipation are all reduced. The flip-flop consumes no static power.

In an embodiment of this invention, a logic element includes a dynamic pull-up element coupled between a first potential source and a first output node. A control electrode of the dynamic pull-up element is coupled to a clock signal. A stack of pull-down elements is coupled between the first output node and a second potential source. This stack of pull-down elements includes: a first transistor having a control electrode coupled to a D input of the logic element; and a second transistor. A delay element is coupled between the clock signal and a control electrode of the second transistor. The delay element provides a delayed clock signal to the second transistor. Further, a storage block may be coupled between the first output node and an output of the logic element for storing a state of the logic element.

In a further embodiment, a method according to the present invention includes the steps of generating a delayed clock signal from a clock signal, where a transition of the delayed clock signal follows a corresponding transition of the clock signal after a delay period, precharging a first node to a first level before the transition in the clock signal, providing data at a data input for storage in the flip-flop at least a minimum setup time before the transition in the clock signal, permitting the data input to change a level at the first node during the delay period, and outputting the level at the first node as an output of the flip-flop.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENT

The present invention is a flip-flop circuit. A flip-flop is a basic logical building block used to create larger, more complex logic circuits. For example, flip-flops may be used in the design of many types of electronic and digital systems including computer systems, telecommunication systems, networking systems, manufacturing systems, graphical systems, consumer systems, and numerous other types of systems. Moreover, the present invention may be embodied on integrated circuits, which may be used to build these systems. In particular, the present invention may be used in microprocessors, memories, ASICs, gate arrays, field programmable gate arrays, programmable logic devices, and many others types of products.

Figure 1:
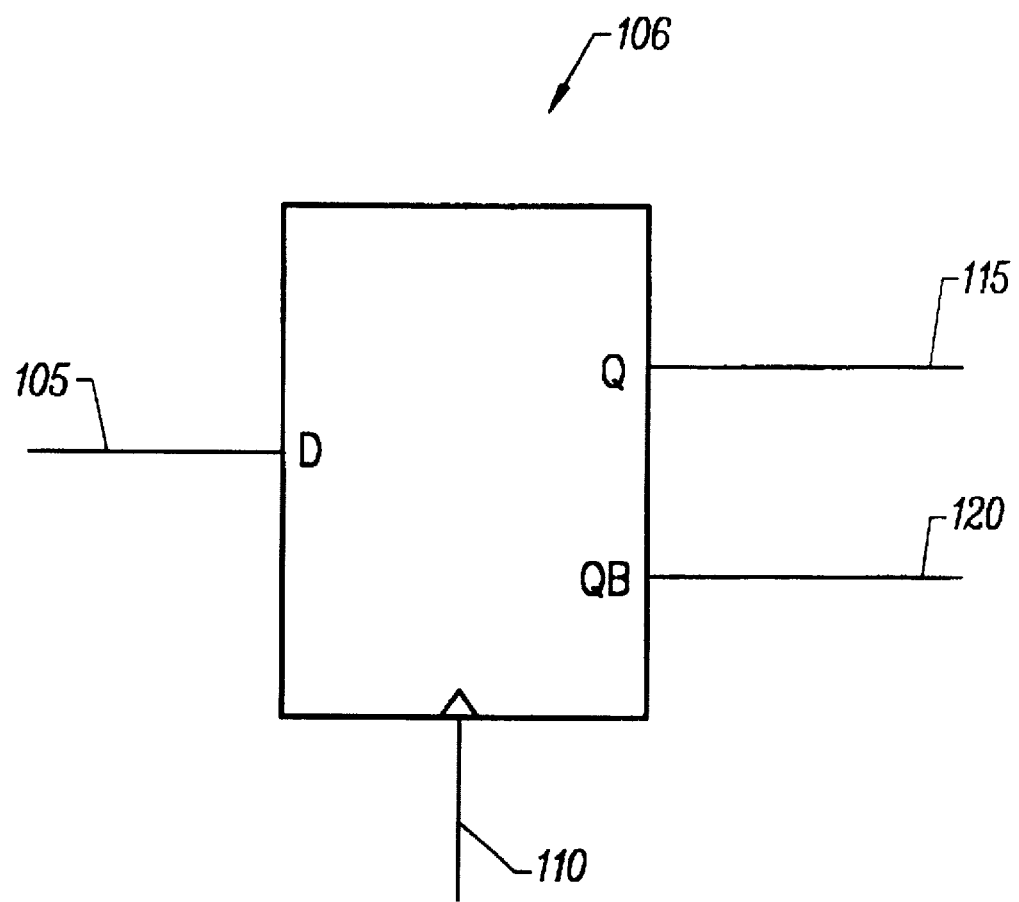
FIG. 1 is a logic diagram of a flip-flop.

FIG. 1 is a diagram of a flip-flop 100. FIG. 1 shows the logic symbol for a basic D-type flip-flop. There are many other types of flip-flops such as T, S-R, and J-K flip-flops. In fact, D flip-flops may be used in the implementation of these other types of flip-flops. In this discussion, D flip-flops are used to illustrate the principles of the present invention. However, the present invention may also be used in the design of many other types of flip-flops.

For flip-flop 100, there is a data (D) input 105, a clock (CLK) input 110, a Q output 115, and (optionally) a complementary QB output 120. A flip-flop is a basic building block of digital logic used to create sequential systems. Flip-flop 100 has memory and is used to construct circuits such as counters, registers, arithmetic accumulators, state machines, and many others. For example, many flip-flops are used in a typical digital system. A typical microprocessor may contain 50,000 or more flip-flops.

Flip-flop 100 is a positive-edge-triggered flip-flop, which means that the data present on D input 105 just before a clock transition for a low-to-high edge of the clock (at CLK input 110) determines the Q output state after the clock has transitioned. A negative-edge-triggered flip-flop may also be constructed similarly. A negative-edge-triggered flip-flop also operates similarly; however, data is clocked on a high-to-low clock edge.

Figure 2:
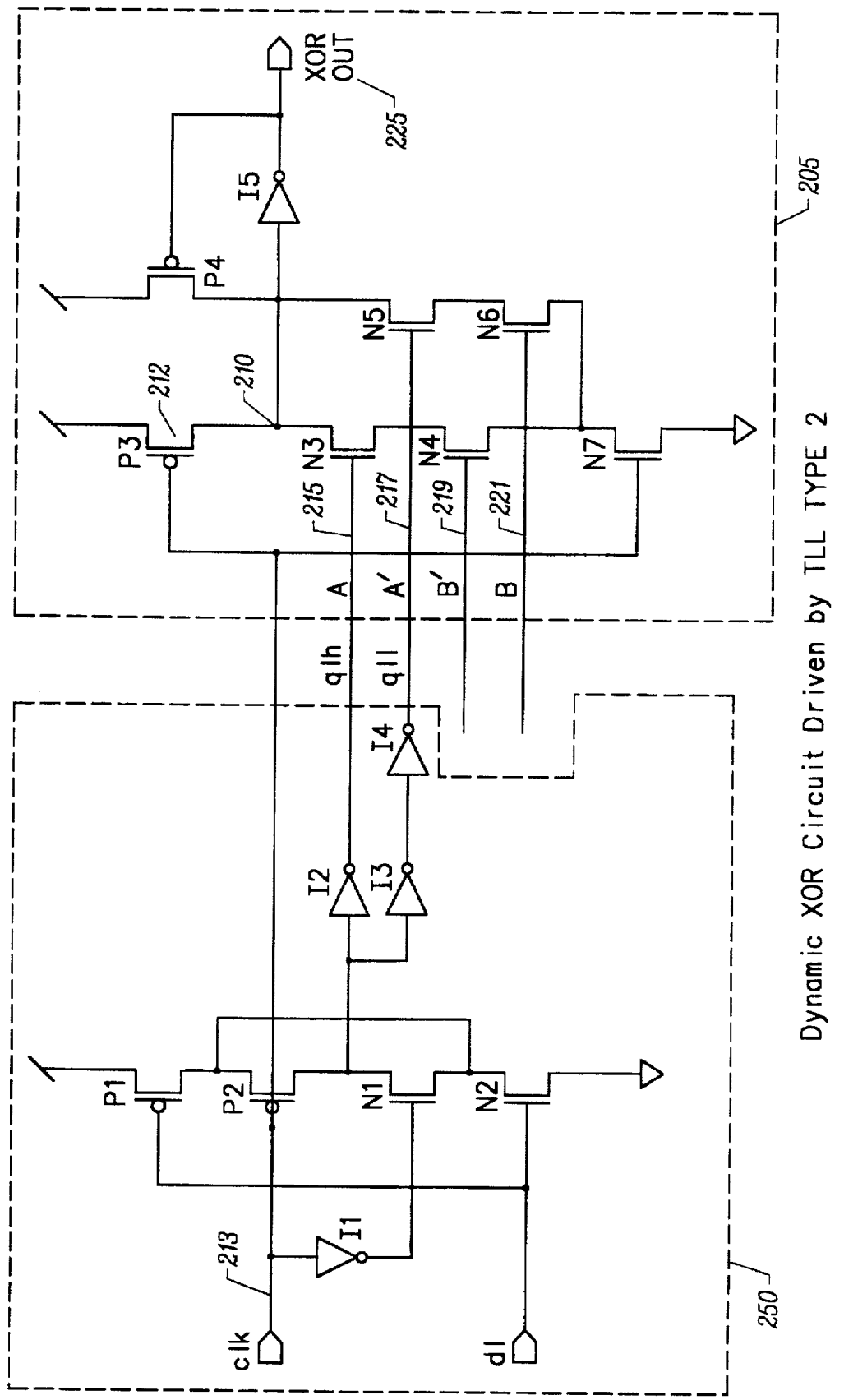
FIG. 2 is a diagram of a dynamic XOR circuit.

FIG. 2 is a diagram of a circuit using dynamic logic (sometimes referred to as "dynamic domino logic"). Dynamic domino circuits are used to achieve generally higher performance than with static logic. However, dynamic domino circuits also generally require circuitry for precharging the dynamic nodes or holding the states of inputs to the dynamic circuitry.

For example, the circuitry in FIG. 2 implements a dynamic exclusive-OR (XOR) gate. A dynamic XOR circuit is shown in box 205. Only a brief description of the circuitry is given, sufficient for an understanding of the present invention. Node 210 is a dynamic node which is precharged to a logic high by transistor 212 when a clock input 213 is low. When clock input 213 becomes high, the XOR function is evaluated based on inputs A 215, A' 217, B' 219, and B 221. These inputs are coupled to control electrodes of a plurality of pull-down transistors. The circuitry performs the logical function A*B+A'*B" which those of skill in the art will recognize as an exclusive NOR (XNOR) function. The result of the function is provided at node 210, which is inverted and buffered to provide an XOR output 225.

However, to implement the dynamic XOR circuitry, static transparent latches (or in other embodiments, flip-flops) are used to hold the data at the inputs of the dynamic XOR gate. For example, a basic latch circuit is shown in box 250 for inputting and holding the states of A 215 and A' 218. Another similar latch, which is not shown, may be used to input and hold the states for B 221 and B' 219. The latches must precede the dynamic XOR structure to hold the data during evaluation to ensure the logic is performed properly. For proper operation of the circuit, the outputs of the latches (i.e., inputs A 215, A' 217, B 221, and B' 219 to the dynamic latch) must be ready by a low-to-high edge of a clock signal at clock input 213. Specifically, it is important to ensure that dynamic node 210 is not pulled low by a latch output that has not switched completely (i.e., at least below the threshold voltage of an NMOS transistor) to turn off one of the pull-down transistors.

The embodiment in FIG. 2 illustrates a dynamic block which responds to a positive clock edge. In particular, precharging occurs when clock input 213 is low, and evaluation occurs when clock input 213 is high. However, in other embodiments, the dynamic block may be designed to operate in response to negative clock edges.

Figure 3:
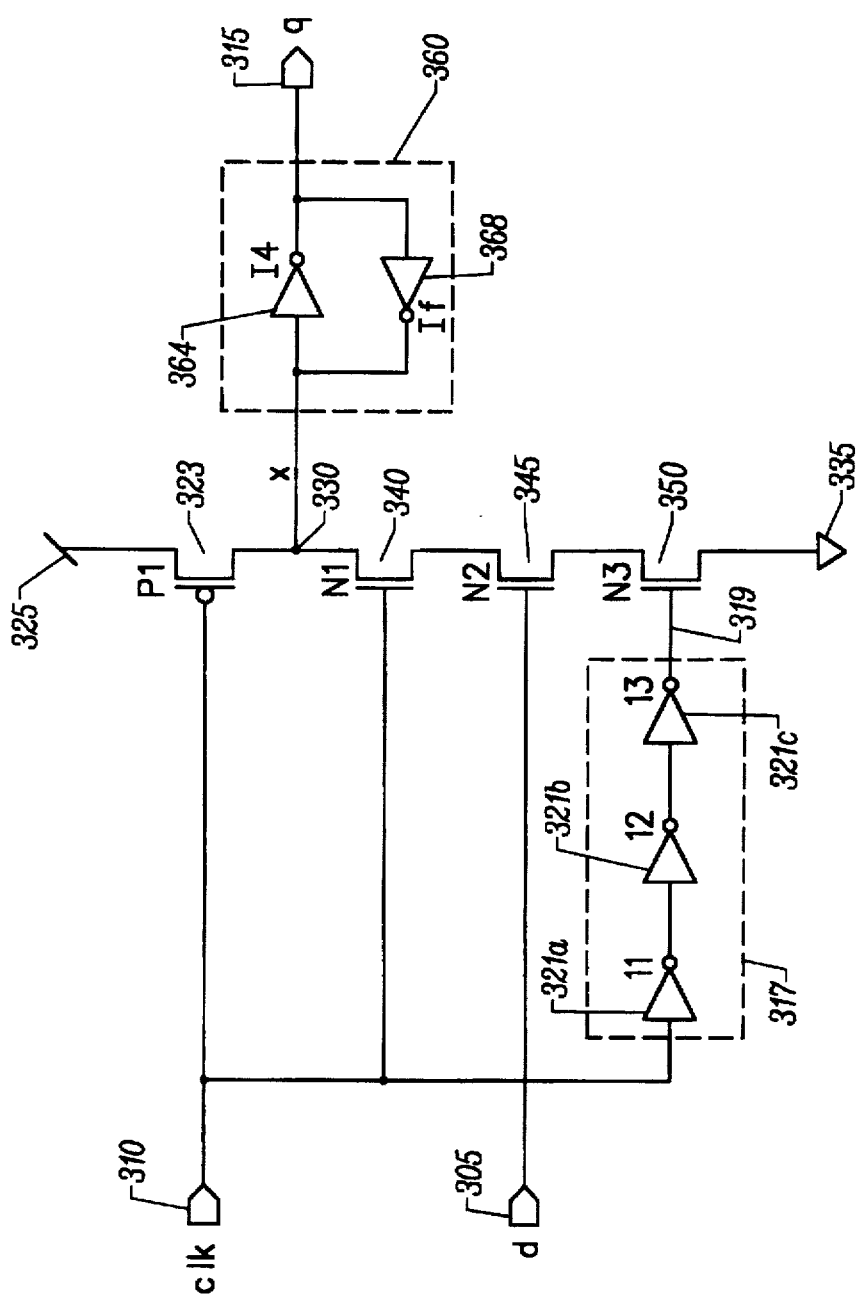
FIG. 3 is a schematic of a single-ended dynamic flip-flop of the present invention.

FIG. 3 is a diagram of an embodiment of a dynamic flip-flop of the present invention. This dynamic flip-flop is of higher performance than a static flip-flop. Furthermore, the dynamic flip-flop may be used in dynamic circuits such as shown in FIG. 2 to provide high performance logic functions. Specifically, the flip-flop may be used in substitution for the latches described in FIG. 2.

The dynamic flip-flop of FIG. 3 has a D input 305, a CLK input 310, and a Q output 315. The flip-flop clocks in data D at D input 305 in response to a positive edge of a CLK signal at CLK input 310, as will now be described. The CLK signal at CLK input 310 is input into a delay block 317, which generates a delayed clock output signal, DELCLK, at a delayed clock output 319. DELCLK is typically an inverse of CLK signal where a falling edge of DELCLK follows a rising edge at CLK by an amount of delay. In one embodiment, where a typical clock speed is about 125 MHz (i.e., clock period of about 8 nanoseconds), this delay may be about two hundred picoseconds.

In a specific embodiment, delay block 317 is implemented using a chain of three inverters 321a–c. Other circuit configurations may be used depending on the amount of delay desired and amount of delay of the individual elements, among other considerations. For example, a delay chain with a single inverter may be used, or in other cases, a chain with more than three inverters may be used. In general, a chain with an odd number of inverters may be used. In alternative embodiments, the delay chain may include an RC delay or other logic elements such as NAND and NOR gates.

A transistor 323 is coupled between a first potential source 325 and a first output node 330. A control electrode of transistor 323 is coupled to D input 305. First potential source 325 is generally the VDD of the integrated circuit. Typical VDD voltages for an integrated circuit include 5 volts, 3.3 volts, 3 volts, and 2.5 volts. However, other VDD voltages may also be used. Also, the circuitry of the present invention may also be used with a "local" VDD which is different from the VDD for the integrated circuit.

A chain of transistors 340, 345, and 350 are coupled between first output node 330 and a second potential source 335. Second potential source 335 is a voltage supply, below the first potential source 325. Second potential source 335 is generally the VSS of the integrated circuit. VSS is typically at ground or zero volts.

Transistors 340, 345, and 350 are stacked and in series. A first transistor 340 in the chain is coupled between first output node 330 and a drain of a second transistor 345. A control electrode of first transistor 340 is coupled to CLK input 310. Second transistor 345 is coupled between a source of first transistor 340 and a drain of a third transistor 350. A control electrode of second transistor 340 is coupled to D input 305. Third transistor 350 is coupled between a source of second transistor 345 and second potential source 335. A control electrode of the third transistor 350 is coupled to delayed clock output 319.

Note that since transistors 340, 345, and 350 are stacked and in series, the gates of these transistors may be coupled to D input 305, CLK input 310, and delayed clock output 319 lines in any order. The order shown may provide better performance due to considerations such as overlap capacitance.

Also, the CLK signal typically traverses and couples to many components on the entire integrated circuit. Therefore, it is desirable be keep the loading on the CLK signal to a minimum. Delay block 317 generally buffers CLK input 310 from transistor 350. Consequently, transistor 350 may be relatively large in size and have substantial capacitive loading, but at the same time, not unduly load the CLK signal. Furthermore, the size of transistor 350 may be adjusted to improve performance of the circuit without greatly affecting the loading on the CLK signal. For example, the transient response of the circuit may be optimum for a particular size of transistor 350, which will provide a particular amount of current driving capability.

When data D at D input 310 is clocked into the flip-flop in response to a positive clock edge at CLK input 310, data D is provided at first output node 330. First output node 330 is coupled to a storage block 360, which stores the data of the flip-flop. Many different storage methods may be used to implement storage block 360. For example, storage block may be a memory cell such as a RAM, DRAM, SRAM, EPROM, EEPROM, and Flash EEPROM, as well as many others.

This diagram shows a relatively simple embodiment of storage block 360. Here, storage block 450 comprises an inverter 364 and a feedback inverter 368. First output node 330 inputs into inverter 364, and inverter 364 outputs to an input of inverter 368. An output of inverter 368 outputs and feeds back into the input of inverter 364. Inverter 364 is typically used to buffer the output of the flip-flop to other circuitry. This also improves the performance of the circuitry by minimizing the loading on first output node 330.

Inverter 368 is a weak feedback inverter used to hold the logic state at first output node 330. Consequently, inverter 368 is typically weaker in drive than the drive capability of the driving transistors, 323, 340, 345, and 350. And, inverter 368 can be made very small, occupying less integrated circuit area. In operation, first output node 330 drives the input of inverter 364. Then, this particular logic state is stored in storage block 360 until it is changed.

In a preferred embodiment, the circuitry is implemented using MOS technology, and more specifically CMOS technology. In particular, transistors 330, 345, and 350 are NMOS transistors, while transistor 323 is a PMOS transistor. The inverters and other logic components may also be implemented using CMOS technology. In other embodiments of the present invention, other technologies may be used, such as bipolar, JFETs, optical switches, and biological switches, to name a few.

The embodiment shown in FIG. 3 is a positive-edge-triggered flip-flop. However, as known to those skilled in the art, the present invention may also be used to construct a negative-edge-triggered flip-flop by modifying the circuitry and logic appropriately. The same features and operation described herein that apply to a positive-edge-triggered flip-flop will also apply to a negative-edge-triggered version.

Figure 4:
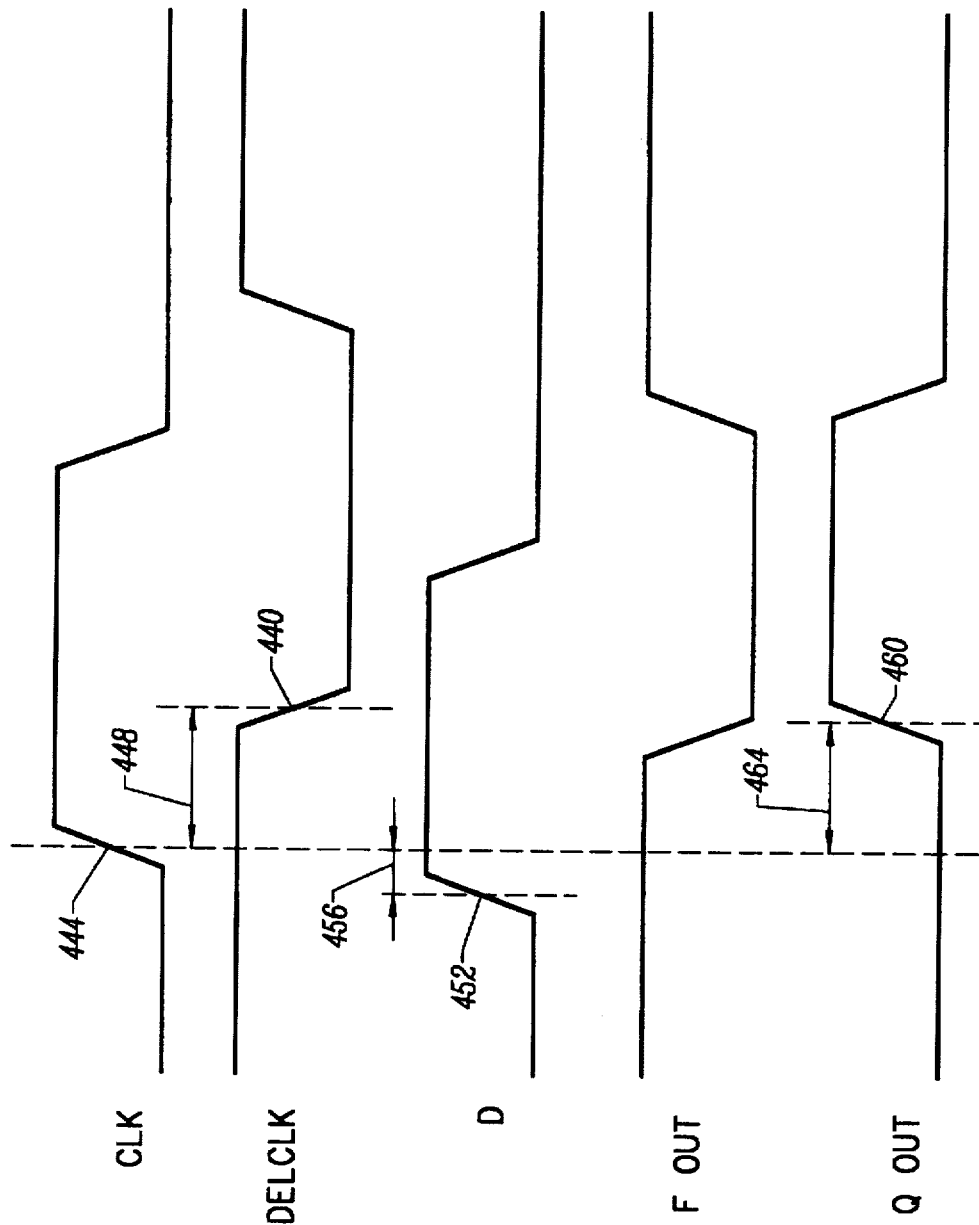
FIG. 4 is a timing diagram for storing a logic high into the dynamic flip-flop of FIG. 3.
Figure 5:
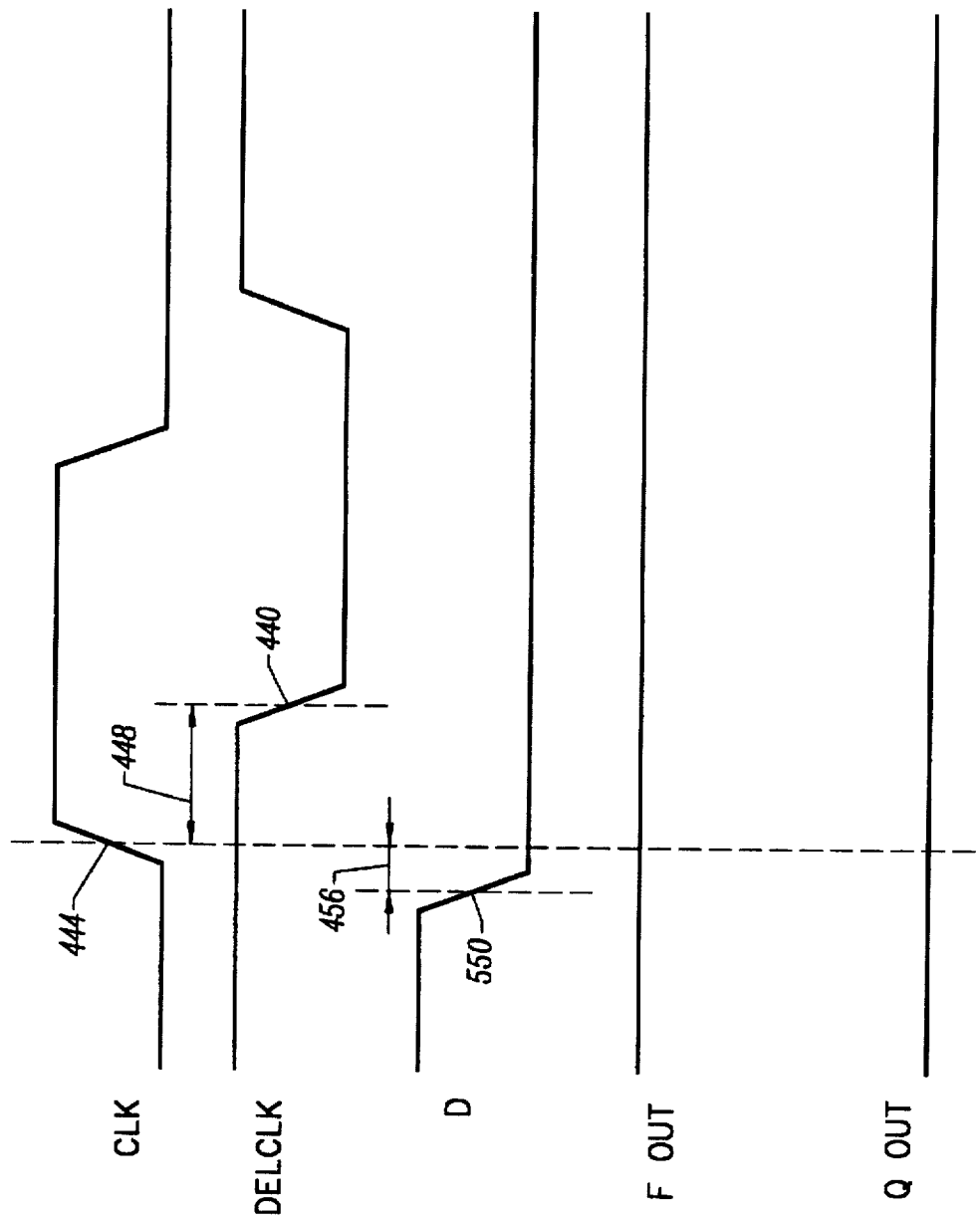
FIG. 5 is a timing diagram for storing a logic low into the dynamic flip-flop of FIG. 3.

The operation of the flip-flop of FIG. 3 will be described in more detail in connection with the timing diagrams of FIGS. 4-5. These timing diagrams are not necessarily drawn to scale, but are useful for illustrating particular features of the present invention. FIG. 4 shows a timing diagram for storing a logic high into the flip-flop while FIG. 5 shows the storing of a logic low. In FIG. 4, waveforms for CLK, DELCLK, D, F OUT, and Q OUT are shown. CLK is a clock signal at CLK input 310. DELCLK is a waveform generated at delayed clock output 319. D shows input data at D input 305 for storing a logic high into the flip-flop. F OUT is the corresponding output at first output node 330. Q OUT is the output at Q output 315.

The flip-flop in FIG. 3 is a dynamic circuit where first output node 330 is precharged to a logic high when the CLK is low. More specifically, when CLK is low, transistor 323 acts as a dynamic pull-up element and precharges the first output node 330 to a logic high. Furthermore, when CLK is low, the series of transistors 340, 345, and 350 will not conduct current since at least one of these transistors is off (e.g., transistor 340). Accordingly, first output node 330 will charge to a full-rail logic high level as shown in FIG. 4. When CLK is low, the logical value at Q output 315 will not be valid data. Therefore, in the present invention, logical functions should not be evaluated during the period when CLK is low.

CLK transitions from a logic low to a logic high at a time 444. A falling edge 440 of DELCLK follows the rising edge 444 of CLK by a delay 448. The data D to be input into flip-flop 400 must be valid at least at time 452 (e.g., the rising edge of the data) before the CLK's rising edge 444. This time is referred to as a minimum setup time (TSU) 456.

When D becomes a logic high, since CLK and DELCLK are also logic high, F OUT becomes a logic low. And, correspondingly, Q OUT becomes a logic high. Current flows through transistor 340, 345, and 350, which act as pull-down elements, to ground. The time from rising edge 444 to a rising edge 460 of Q OUT is referred to a clock-to-output time (TCO) 464.

Furthermore, for the circuit of the present invention, the TCO time will typically be very fast. When CLK is high, PMOS transistor 323 is off. First output node 330 is held high only weakly by inverter 368. Transistors 340, 345, and 350 have comparatively stronger drive, and will quickly pull down the logic high at first output node 330. Then, Q output 315 will quickly transition to a logic high. This is a performance advantage of a dynamic circuit. First output 330 is precharged, but not strongly held. Consequently, there is not a large magnitude of current or charge that needs to be channelled from first output node 330 to ground. This greatly improves the speed of the transition. Also, the sizes of the devices can be made smaller which saves space.

Storage block 360 will hold the logic high state of flip-flop 200. A QB output, the inverse of Q output 315 may be generated by inverting Q output 315.

During the period when CLK is high and the data has settled, the data at Q output 316 will be valid. Logical functions may be evaluated during this period of time, but before CLK returns low. As described above, when CLK returns low, the flip-flop circuit will be precharged in preparation for the next transition, and the data outputs will not be valid for evaluation.

Similar to FIG. 4, FIG. 5 shows a timing diagram for storing a logic low into the flip-flop. As above, waveforms for CLK, DELCLK, D, F OUT, and Q OUT are shown. Also as described above, during the period when CLK is low, first output node 330 is being precharged to a logic high. Logical outputs will not be valid during this time; and, logical functions should not be evaluated. CLK transitions from low to high. The falling edge 440 of DELCLK follows the rising edge 444 of the CLK by a delay 448. The data D to be input into flip-flop 200 must be valid at least at time 550 (e.g., the falling edge of the data) before the clock's rising edge 444. This is the minimum setup time (TSU) 456.

D becomes a logic low. During delay 448, D will be a logic low, and CLK and DELCLK are logic highs. F OUT, at first output node 330, will be a logic high. In particular, F OUT was precharged high when CLK was low. F OUT remains high since there is no conducting path through the series-connected transistors 340, 345, and 350 (i.e., transistor 345 is off). Q OUT will become a logic low. Storage block 360 will store the logic low state of the flip-flop.

The TCO time for this storing this data will be extremely fast since Q output 315 does not require a transition into the proper state. This is an advantage of a dynamic circuit. Furthermore, the flip-flop circuitry may be designed to take advantage of this extremely fast TCO time for storing a logic low. For example, the circuitry may be designed to skew performance in favor of the low-to-high transition at Q OUT (i.e., storing a logic high). This will generally not affect greatly the TCO time for storing a logic low. In effect, this technique tends to equalize the TCO edges, thereby improving the overall TCO performance.

TSU and TCO are parameters which are generally critical to the performance of the entire integrated circuit. It is desirable to minimize TSU and TCO in order to maximize the performance of the integrated circuit, especially the transient performance. Specifically, the combination of TSU and TCO should be kept at a minimum. A minimum TSU and TCO means that the flip-flop will operate at a maximum frequency, which improves the transient performance of the integrated circuit. Compared to prior art flip-flops, the flip-flop of the present invention is about twice as fast. Furthermore, compared to typical flip-flops, the flip-flop of the present invention also has fewer components, thereby requiring less layout area.

Generally, the longer delay 448 is, the longer the data must be held (hold time or TH) or else wrong data may be clocked into the flip-flop. For example, the hold time for the present invention may be positive. It is somewhat desirable to minimize the hold time at D input 305, making it zero or negative. However, a positive hold time may be compensated for by increasing the amount of delay of the circuitry coupling to D input 305.

A tradeoff exists between TH, TSU, and TCO. Generally, to maximize performance, TSU and TCO are the critical parameters. In order to maximize performance, in a preferred embodiment, delay 448 should be less than TCO 464. This also prevents race conditions from occurring. In the circuit configuration of FIG. 3, delay 448 is created using a chain of three inverters 321a–c. However, a delay 448 which is too short creates problems too. For example, among other problems, a very short delay 448 also decreases the safety margin for latching data correctly.

The flip-flop of the present invention essentially includes an "implicit" one-shot to generate the delayed clock output 319. This implicit one-shot is a current one-shot, which latches in the data after a delay 448 after the positive clock edge 444. Optimizing this implicit one-shot permits the flip-flop to operate at maximum speed. Specifically, during the period of delay 448, data at D input 305 may be clocked into the flip-flop.

For example, during delay 448, the signals at CLK input 310 and delayed clock output 319 become logic high. Then, Q output 315 will become the logic state at D input 305 at the time of a positive clock edge 444 at CLK input 310. During other periods of time, the flip-flop ignores the data at D input 305. Another characterization of the present invention is that of a flip-flop having a single buffer, which passes data clocked-in during the delay 448 period (where this delay is created using the implicit one-shot).

Note also, the flip-flop of the present invention does not consume power except during a transition. Typically, the signal at CLK input 310 is the inverse of the signal at delayed clock output 319. Consequently, the stack of transistors 340, 345, and 350 will be decoupled from ground. No current will flow. Storage block 368 continues holding the flip-flop logic state. Further, the other logic gates in the flip-flop are static gates. Therefore, the flip-flop of the present invention consumes zero static power.

Figure 6:
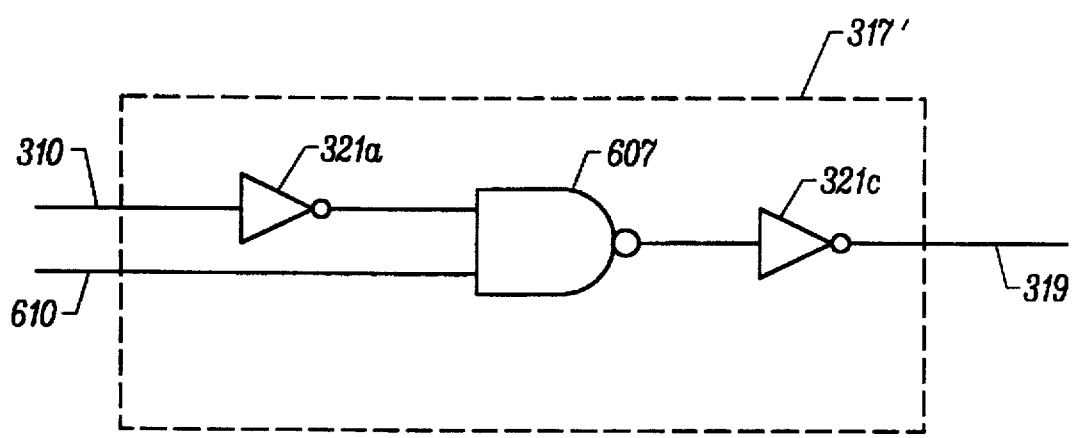
FIG. 6 is circuitry for providing an enable control for a dynamic flip-flop of the present invention.

FIG. 6 shows an alternative embodiment of the delay block 317' of the present invention. This implementation of delay block 317' permits an enable function for the flip-flop of FIG. 3. The enable function is used to enable or disable clocking of data into the flip-flop. The enable function is useful in the design of many logic functions. For example, in a microprocessor, a number of flip-flops with enable function may be used to create a register which has an enable feature.

In FIG. 6, the circuitry is very similar to a chain of three inverters 321a–c as shown in FIG. 3, except that the middle inverter 321b is replaced with a NAND gate 607 having an input coupled to an enable input 610. This implementation of delay block 405' provides the necessary delay 456 and also provides an enable function. When an enable signal at enable input 610 is a logic high, then NAND gate 607 functions like an inverter. Delay block 317' functions as discussed above, providing delayed clock output 319. Clocking and normal operation of the flip-flop is enabled.

On the other hand, when the enable signal at enable input 610 is a logic low, NAND gate 607 will output a logic high regardless of the state of CLK input 310. Then, the output at delayed clock output 319 will be a logic low. This disables the clocking of the flip-flop. More specifically, referring to the circuit in FIG. 3, since node 319 is a logic low, transistor 350 will be off, and node 330 will be decoupled from VSS. New data may not be clocked into the flip-flop, and the data stored in storage block 360 will be the precharged value, a logic low at node 315.

Also, note that this enable function is a synchronous enable. For proper operation, the enable signal at enable input 610 should meet the minimum setup time requirements discussed above. Also, since this enable function disables the circuits in the flip-flop, when the flip-flop is disabled, no power is consumed. Consequently, this enable function may be used as a power savings feature. For example, in a microprocessor, to reduce overall power consumption, certain portions of the circuitry may be disabled.

Figure 7:
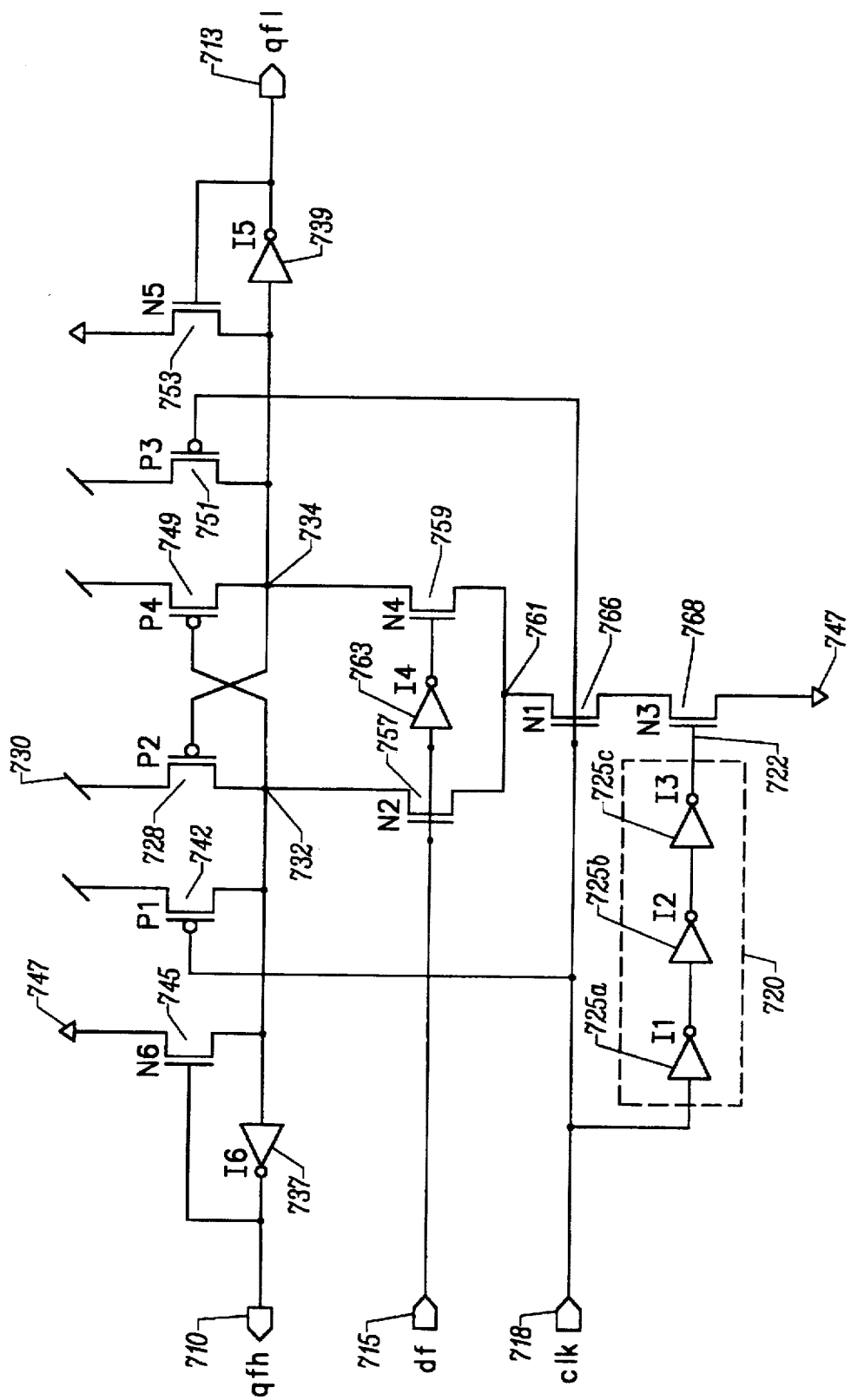
FIG. 7 is a schematic for a dual-rail dynamic flip-flop of the present invention.

FIG. 7 is a diagram of a dual-rail dynamic flip-flop of the present invention. This flip-flop is similar to the flip-flop in FIG. 3, but provides a QFH output 710 and QFL output 713. When the outputs are ready for evaluation, QFL output 713 is the inversion of QFH output 710. Many features of the present embodiment are similar to those described for the flip-flop in FIG. 3.

As inputs for the flip-flop, a DF input 715 is used for data and a CLK input 718 is used for a clocking signal. CLK 718 is coupled to a delay block 720, which generates a delayed clock output signal, DELCLK, at a delayed clock output 722. DELCLK is typically an inverse of CLK signal, where a falling edge of DELCLK follows a rising edge at CLK by an amount of delay. In one embodiment, where a typical clock speed is about 125 Mhz (i.e., clock period of about 8 nanoseconds), this delay may be about two hundred picoseconds.

In a specific embodiment, delay block 720 is implemented using a chain of three inverters 725a–c. Other circuits configurations may be used depending on the amount of delay desired and amount of delay of the individual elements, among other considerations. For example, a delay chain with a single inverter may be used, or in other cases, a chain with more than three inverters may be used. In general, a chain with an odd number of inverters may be used. In alternative embodiments, the delay chain may include an RC delay or other logic elements such as NAND and NOR gates.

The circuit includes a transistor 731, coupled between a first potential source 730 and a node 732. The first potential source 730 is typically VDD. A control electrode of transistor 728 is coupled to a node 734. An inverter 737 is coupled between node 732 and node 710. An inverter 739 is coupled between node 734 and node 713. In parallel with transistor 728, a transistor 742 is coupled between first potential source 730 and node 732. A control electrode of transistor 742 is coupled to CLK input 718. A transistor 745 is coupled between node 732 and a second potential source 747. A control electrode of transistor 745 is coupled to QFH output 710, also an output of inverter 737. The second potential source 747 is typically VSS.

At node 734, transistors are coupled in a symmetrical way to those at 732. In particular, a transistor 749 is coupled between first potential source 730 and node 734. A control electrode of transistor 749 is coupled to node 732. A transistor 751 is coupled between first potential source 730 and node 734. A control electrode of transistor 751 is coupled to CLK input 718. A transistor 753 is coupled between node 734 and the second potential source 747. A control electrode of transistor 753 is coupled to QFL output 713, also an output of inverter 739.

A transistor 757 and a transistor 759 couples nodes 732 and 734, respectively to a node 761. A control electrode of transistor 757 is coupled to DF input 715. A control electrode of transistor 759 is coupled to an inversion of DF input 715, an output of an inverter 763. At node 761, a chain of series-connected transistors includes a transistor 766 and a transistor 768. Transistor 766 is coupled between a node 761 and an electrode of transistor 768. A control electrode of transistor 766 is coupled to CLK input 718. Transistor 768 is coupled between an electrode of transistor 766 and the second potential source 747. A control electrode of transistor 768 is coupled to delayed clock output 722.

In a preferred embodiment, the circuitry is implemented using MOS technology, and more specifically CMOS technology. In particular, transistors 728, 742, 749, and 751 are PMOS transistors. Transistors 745, 753, 757, 759, 766, and 768 are NMOS transistors. Inverters and other logic components may also be implemented using CMOS technology. In other embodiments of the present invention, other technologies may be used, including bipolar, JFETs, optical switches, and biological switches, to name a few.

The embodiment shown in FIG. 7 is a positive-edge-triggered flip-flop. However, as known to those skilled in the art, the present invention may also be used to implement a negative-edge-triggered flip-flop by modifying the circuitry and logic appropriately. The same features and operation described herein that apply to a positive-edge-triggered flip-flop will also apply to a negative-edge-triggered embodiment.

Figure 8:
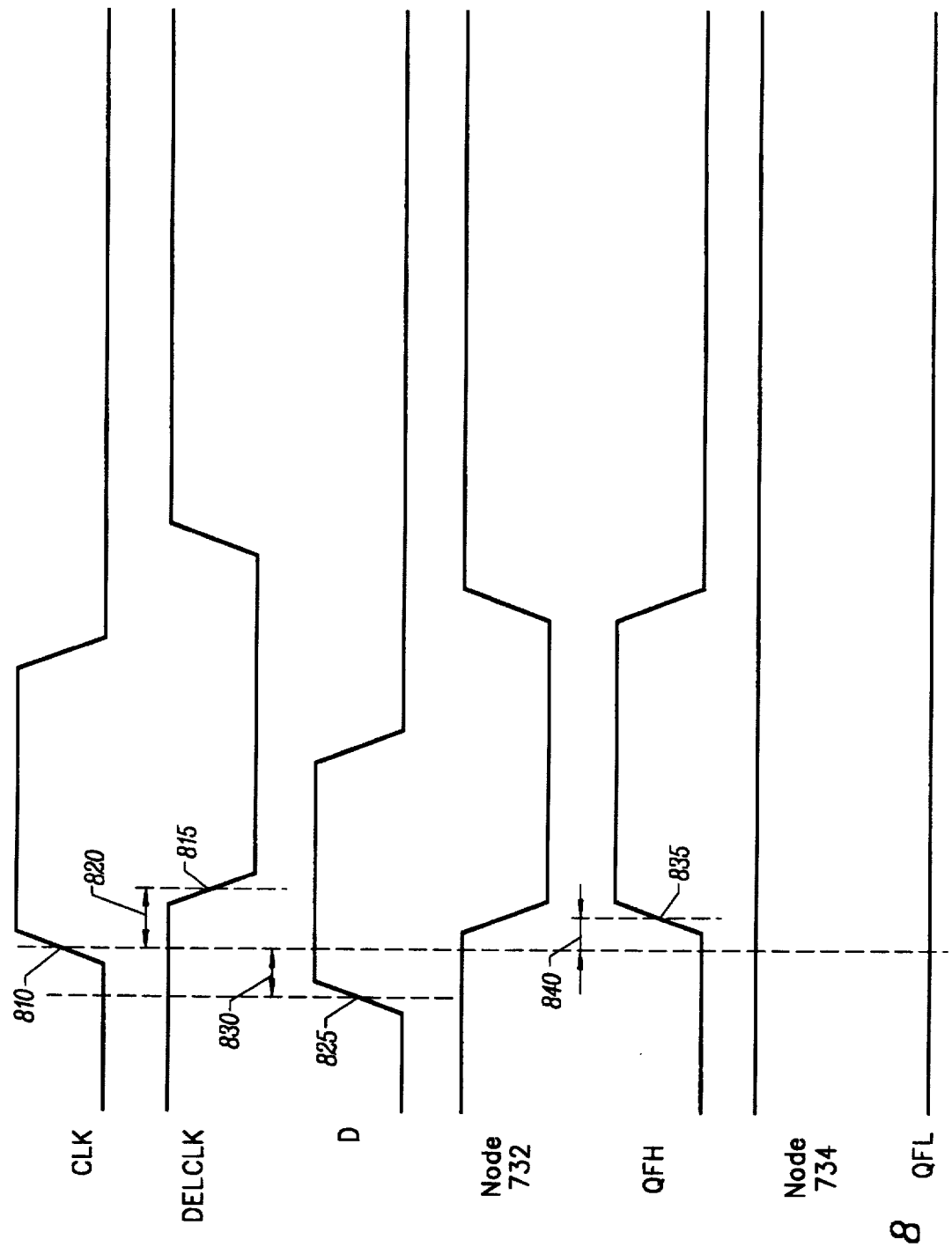
FIG. 8 is a timing diagram for storing a logic high into the dynamic flip-flop of FIG. 7.

The operation of the flip-flop in FIG. 7 is described in connection with the timing diagrams in FIGS. 8–9. These timing diagrams are not necessarily drawn to scale, but are useful for illustrating particular features of the present invention. FIG. 8 shows a timing diagram of storing a logic high into the flip-flop, while FIG. 9 shows the storing of a logic low.

Figure 9:
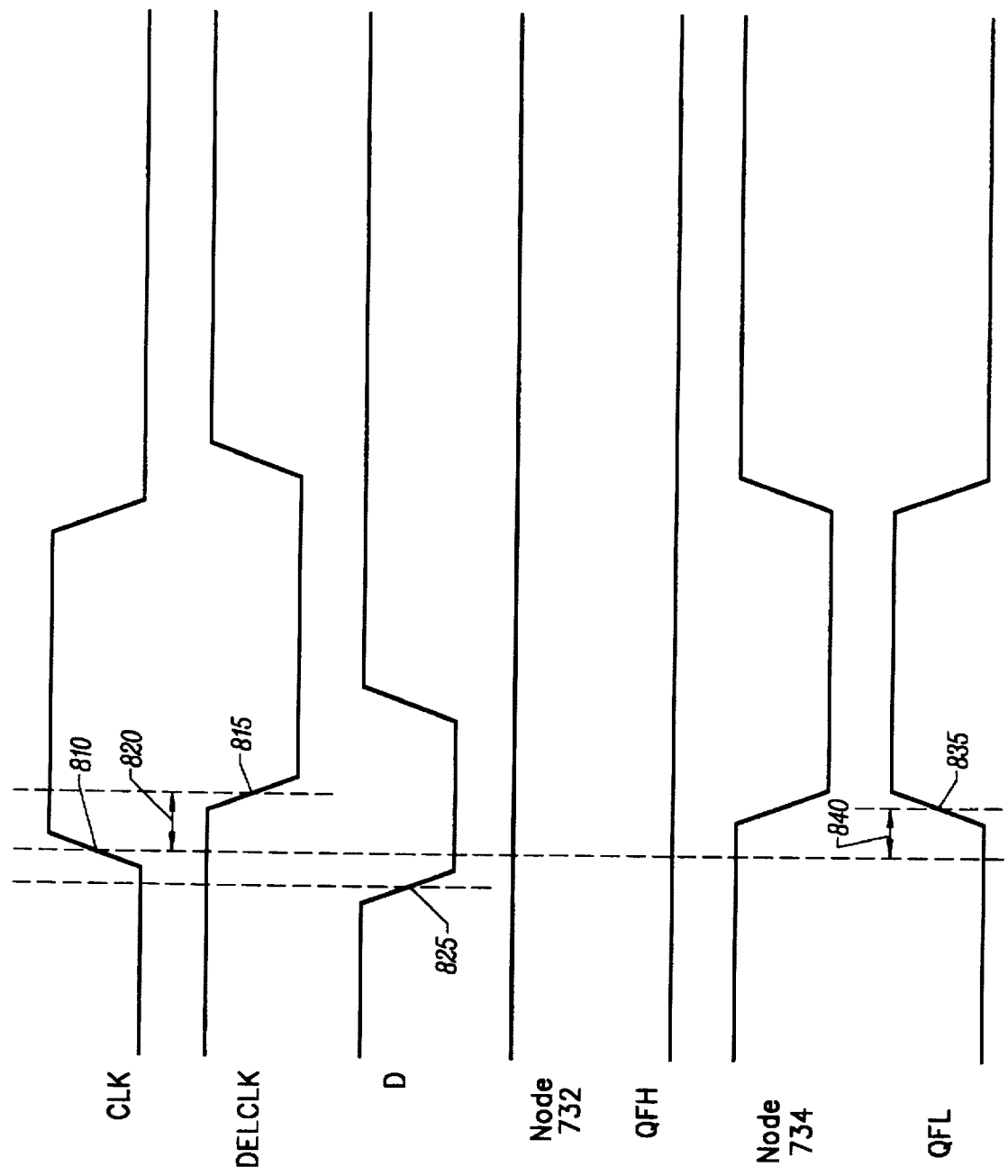
FIG. 9 is a timing diagram for storing a logic low into the dynamic flip-flop of FIG. 7.

In FIGS. 8–9, waveforms for CLK, DELCLK, D, node 732, QFH, node 734, and QFL are shown. CLK is a signal provided at CLK input 718. DELCLK is a signal at delayed clock output 722. D is a signal provided at DF input 715. Node 732 is the output signal at node 732. QFH is an output signal at QFH output 710. Node 734 is the output signal at node 734. QFL is an output signal at QFL output 713.

Before logic may be evaluated, the dynamic flip-flop in FIG. 7 is precharged. Consequently, when CLK is low, both nodes 732 and 734 are precharged to a logic high, through transistors 742 and 751, respectively. Nodes 732 and 734 are charged to a logic high since no current flows to ground because transistor 755 is off. Transistors 745 and 753 are also off. When CLK is low, the logical values at QFH 710 and QFL 713 are not valid data. Logical functions should not be evaluated during the period when CLK is low.

CLK transitions from a logic low to a logic high at time 810. A falling edge 815 or DELCLK follows the rising edge 810 of CLK by a delay 820. Delay 820 may be less than the clock width of CLK. Depending on the design, delay 820 may be for example, 500, 400, 300, 250, 200, 180, 150, 130, and 100 picoseconds. Delay 820 may also be less than 100 picoseconds, such as 80, 60, 40, and 20 picoseconds. When designing a circuit, a minimum delay is selected in order to maximize circuit performance, but also enable reliable circuit operation.

The data D to be input into the flip-flop must be valid at least at time 825 (i.e., the rising edge of the data) before the CLK's rising edge 810. This time is the minimum setup time (TSU) 830.

For storing a logic high, as shown in FIG. 8, D transitions from a low to a high. When D becomes logic high, since CLK and DELCLK are also logic high during delay period 820, node 732 will become a logic low and node 734 will remain a logic high. Accordingly, QFH will become at logic high at time 835, and QFL will remain a logic low. Time 840 indicates the clock-to-output time (TCO). The circuitry of the present invention has especially high-speed performance. For QFH, since node 732 is precharged and not strongly held high, during a transition, node 732 is rapidly discharged through transistors 757, 761, and 768. Furthermore, transistors 757, 761, and 768 need not be especially large since no large currents are being displaced. For QFL, since the node 734 is precharged, there is no delay when providing the correct logical output because QFL is already at the proper value.

For the QFH output rail, the combination of inverter 737, transistor 745, and transistor 728 is used as a latch to hold node 732 at a logic low. Transistor 728 is off since node 734 is a logic high. Transistor 745 is on, and pulls node 732 to a logic low. Hence, these components implement a storage block much like storage block 360 of FIG. 3. In other embodiments of the present invention, the storage capability may be implemented using other techniques, as described above. For the QFL output rail, which is symmetrical to the QFH side, the combination of inverter 739, transistor 753 and transistor 734 is used to hold node 734 at a logic high. Transistor 753 is off. Transistor 749 is on because node 732 is a logic low. Thus, transistor 749 pulls node 734 to a logic high.

During the period when DELCLK is low and before CLK transitions to logic high, logical functions may be evaluated. When CLK returns low, the flip-flop circuit will be precharged, and the data outputs will not be valid for evaluation.

FIG. 9 shows the timing waveforms for storing a logic low. The waveforms are similar to those in FIG. 8, except for the waveforms for D, node 732, QFH, node 734, and QFL. As discussed earlier, the circuit embodiment of the present invention in FIG. 7 exhibits symmetry about the outputs QFH 710 and QFL 713, and accordingly, nodes 732 and 734. Hence, the operation of the circuitry is also symmetrical. When storing a logic low, D transitions from high to low. Correspondingly, the outputs at QFH 710 and QFL 713 transition in opposite directions to that shown in FIG. 8. Although different, but analogous devices are involved, the operation of the circuitry is also similar to that described above. The symmetry of the circuitry is further evidenced by the timing waveforms for node 732, QFH, node 734, and QFL. In FIG. 9, the signals for node 732 and QFH are similar to those for node 734 and QFL in FIG. 8. And, the signals for node 734 and QFL of FIG. 9 are similar to those for node 732 and QFH of FIG. 8. The symmetry of the present invention tends to minimize layout area, provide more predictable and balanced performance characteristics on both edges, and improve the design from a manufacturability point of view.

Delay block 720 of FIG. 7 may be substituted with delay block 317' of FIG. 6 to provide enable control. The enable control would operate similarly as described above.

Figure 10:
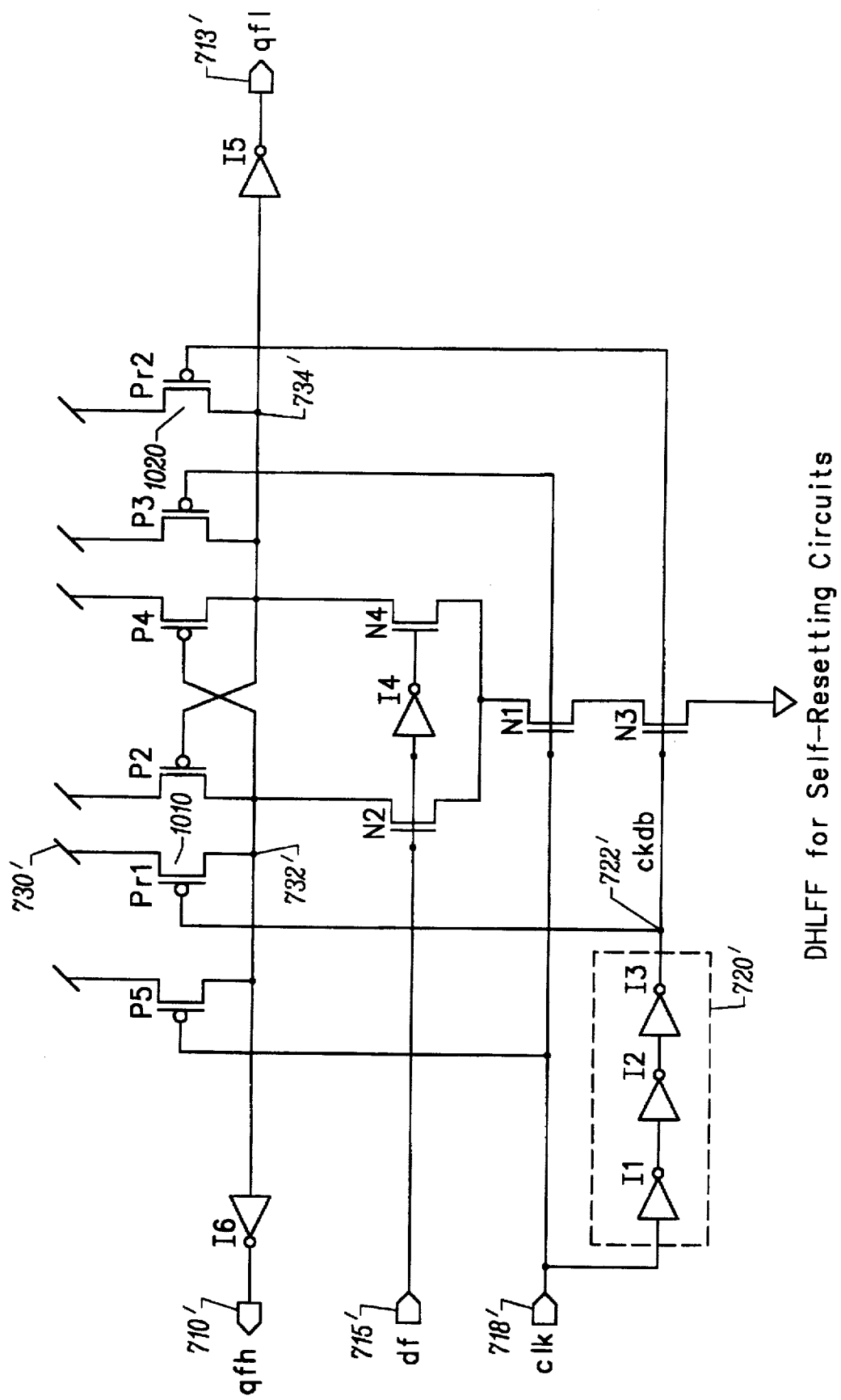
FIG. 10 is a schematic for a dual-rail dynamic flip-flop of the present invention with self-resetting feature.

FIG. 10 is a flip-flop of the present invention which is self-resetting and provides dual-rail output. Except for several circuit changes, the circuitry is especially similar to that shown in FIG. 7, and only the differences between the designs will be discussed. Transistors 745 and 753 have been omitted. A transistor 1010 is coupled between a node 732' and a first potential source 730'. A control electrode of transistor 1010 is coupled to a delayed clock output 722'. A transistor 1020 is coupled between a node 734' and first potential source 730'. A control electrode of transistor 1020 is coupled to delayed clock output 722'.

The circuit in FIG. 10 operates somewhat similarly to FIG. 7. However, after DELKCLK (see FIGS. 8–9) at a delayed clock output node 722' becomes a logic low, nodes 732' and 734' are reset through transistors 1010 and 1020, respectively to logic high. Accordingly, QFH output 710' and QFH output 713' will become logic low. In this self-resetting embodiment, logical functions should be evaluated after the outputs have settled, but during the delay period 820 (see FIGS. 8–9) when both CLK and DELCLK are high, and before DELCLK becomes low.

Self-resetting logic allows the outputs 710' and 713' to become preset to a low value more quickly than the embodiment in FIG. 7, where preset does not begin until CLK returns low. Therefore, the self-resetting logic may improve circuit performance since when CLK returns low, the circuitry is ready for the next logical operation. Further, there is no need for latches (i.e., transistors 745 and 753 in FIG. 7) or other storage blocks at the outputs since data is not held when CLK is high. Although self-resetting logic may improve circuit performance, the timing of the input signals, evaluation of the outputs, and other similar considerations become more critical factors for proper circuit operation.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A logic element comprising:
   a dynamic pull-up element coupled between a first potential source and a first output node, wherein a control electrode of the dynamic pull-up element is coupled to a clock signal;
   a stack of pull-down elements coupled between the first output node and a second potential source, comprising:
      a first transistor comprising a control electrode coupled to a D input of the logic element; and
      a second transistor; and
   a delay element, coupled between the clock signal and a control electrode of the second transistor, wherein the delay element provides a delayed clock signal to the second transistor.

2. The logic element of claim 1 further comprising a storage block, coupled between the first output node and an output of the logic element, for storing a state of the logic element.

3. The logic element of claim 1 further comprising:
   a primary buffer having an input coupled to the first output node; and
   a feedback buffer having an input coupled to an output of the primary buffer, wherein an output of the feedback buffer feeds back to the first output node in order to maintain a state of the first output node.

4. The logic element of claim 1 wherein the dynamic pull-up element precharges the first output node when the clock signal is a logic low, and is decoupled from the first output node when the clock signal is a logic high.

5. The logic element of claim 1 wherein data is latched during a delay period when the clock signal is a logic high and the delayed clock signal is a logic high.

6. The logic element of claim 5 wherein the delay period is less than about 200 picoseconds.

7. The flip-flop of claim 5 wherein the first output node is reset to a logic high when not in the delay period.

8. The logic element of claim 1 wherein the delayed clock signal is an inversion of the clock signal, and a falling edge of the delayed clock signal occurs after a rising edge of the clock signal.

9. The logic element of claim 8 wherein the falling edge of the delayed clock signal occurs about three buffer delays after the rising edge of the clock signal.

10. The logic element of claim 1 wherein the delay element comprises an odd-numbered chain of inverters.

11. The logic element of claim 1 wherein the delay element comprises at least three inverters.

12. A flip-flop comprising:
a first dynamic pull-up element coupled to precharge a first output node to a precharged state;
a first transistor coupled to discharge the first output node and having a control electrode coupled to a data input providing data for storage in the flip-flop;
a pull-down device coupled to enable a path for the first transistor to discharge the first output node; and
a delay block coupled to provide a delayed clock signal from a clock signal, whereby the pull-down device enables the first transistor to discharge the first output node during a delay period after a transition of the clock signal and before a resulting transition in the delayed clock signal.

13. The flip-flop of claim 12 further comprising:
a second dynamic pull-up element coupled to precharge a second output node to the precharged state; and
a second transistor coupled to discharge the second output node and having a control electrode coupled to an inversion of the data input, whereby the pull-down device enables the second transistor to discharge the second output node during the delay period.

14. The flip-flop of claim 12 wherein the pull-down device comprises:
a first pull-down transistor having a control electrode coupled to the clock signal; and
a second pull-down transistor having a control electrode coupled to the delayed clock signal.

15. The flip-flop of claim 13 further comprising:
a storage block for holding a state of the first output node after the delay period comprising:
an inverter coupled to the first output node;
a first feedback transistor coupled to the first output node and having a control electrode coupled to an output of the first inverter; and
a second feedback transistor coupled to the first output node and having a control electrode coupled to the second output node.

16. The flip-flop of claim 12 further comprising:
a second transistor coupled to the first output node and having a control electrode coupled to the delayed clock output, wherein the second transistor resets the first output node to a precharged state after the delay period.

17. The logic element of claim 12 wherein the delayed clock signal is an inversion of the clock signal, and a falling edge of the delayed clock signal follows a rising edge of the clock signal, delayed by the delay period.

18. The flip-flop of claim 12 wherein the delay block comprises an odd-numbered chain of inverters.

19. The flip-flop of claim 12 wherein the delay block provides less than about a 200-picoseconds delay.

20. A method of performing a flip-flop logic function comprising the steps of:
generating a delayed clock signal from a clock signal, wherein a transition of the delayed clock signal follows a corresponding transition of the clock signal after a delay period;
precharging a first node to a first level before the transition in the clock signal;
providing data at a data input for storage in the flip-flop at least a minimum setup time before the transition in the clock signal;
permitting the data input to change a level at the first node during the delay period; and
outputting the level at the first node as an output of the flip-flop.

21. The method of claim 20 wherein the delay period is three buffer delays.

22. The method of claim 20 wherein the delay period is less than about 200-picoseconds.

23. The method of claim 20 wherein the transition of the delayed clock signal is in a direction opposite to the corresponding transition of the clock signal.

24. The method of claim 20 further comprising the steps of:
holding the level at the first node until a next transition in the clock signal; and
at the next transition in the clock, precharging the first node to the first level.

25. The method of claim 20 further comprising the steps of:
holding the level at the first node until the transition in the delayed clock signal; and
resetting the first node to the first level after the delay period and the transition in the delayed clock signal.

26. The method of claim 20 further comprising the steps of:
precharging a second node to the first level before the transition in the clock signal;
permitting the data input to change a level at the second node during the delay period, wherein the level at the second node is an inversion of the level at the first node; and
outputting the level at the second node as an output for the flip-flop.

* * * * *

UNITED STATES PATENT AND TRADEMARK OFFICE
CERTIFICATE OF CORRECTION

PATENT NO.   : 5,764,089

DATED        : June 9, 1998

INVENTOR(S)  : HAMID PARTOVI, ROBERT C. BURD, UDIN SALIM, FREDERICK WEBER, LUIGI DI GREGORIO and DONALD A. DRAPER It is certified that error appears in the above-identified patent and that said Letters Patent is hereby corrected as shown below:

On the title page, item [73], should read as follows:
Assignee: ADVANCED MICRO DEVICES, INC., Sunnyvale, Calif.

Signed and Sealed this

Third Day of November, 1998

*Attest:*

BRUCE LEHMAN

*Attesting Officer*                *Commissioner of Patents and Trademarks*